United States Patent
Nakano et al.

(10) Patent No.: US 9,406,756 B2
(45) Date of Patent: Aug. 2, 2016

(54) SEMICONDUCTOR DEVICE AND METHOD FOR MANUFACTURING THE SEMICONDUCTOR DEVICE

(71) Applicant: ROHM CO., LTD., Kyoto-shi, Kyoto (JP)

(72) Inventors: Yuki Nakano, Kyoto (JP); Ryota Nakamura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/283,415

(22) Filed: May 21, 2014

(65) Prior Publication Data

US 2014/0346529 A1    Nov. 27, 2014

(30) Foreign Application Priority Data

May 21, 2013   (JP) .................. 2013-107350

(51) Int. Cl.
| | | |
|---|---|---|
| H01L 21/00 | (2006.01) | |
| H01L 29/16 | (2006.01) | |
| H01L 29/872 | (2006.01) | |
| H01L 21/04 | (2006.01) | |
| H01L 21/324 | (2006.01) | |
| H01L 29/78 | (2006.01) | |

(52) U.S. Cl.
CPC .......... *H01L 29/1608* (2013.01); *H01L 21/045* (2013.01); *H01L 21/046* (2013.01); *H01L 21/0465* (2013.01); *H01L 21/324* (2013.01); *H01L 29/7827* (2013.01); *H01L 29/872* (2013.01)

(58) Field of Classification Search
CPC ... H01L 21/045; H01L 21/046; H01L 21/324; H01L 29/36; H01L 29/1608; H01L 29/872; H01L 21/0465; H01L 29/7827
See application file for complete search history.

(56) References Cited

U.S. PATENT DOCUMENTS 8,618,553 B2 * 12/2013 Carter et al. .................... 257/77

FOREIGN PATENT DOCUMENTS

JP        2005-353771        12/2005

* cited by examiner

*Primary Examiner* — Richard Booth
(74) *Attorney, Agent, or Firm* — Hamre, Schumann, Mueller & Larson, P.C.

(57) ABSTRACT

A semiconductor-device manufacturing method of the present invention includes a step of selectively implanting impurity ions into a surface of an SiC semiconductor layer and forming impurity regions and a step of activating the impurity ions by annealing the SiC semiconductor layer at a temperature of 1400° C. or more when the surface of the SiC semiconductor layer is covered with an insulating film.

5 Claims, 16 Drawing Sheets

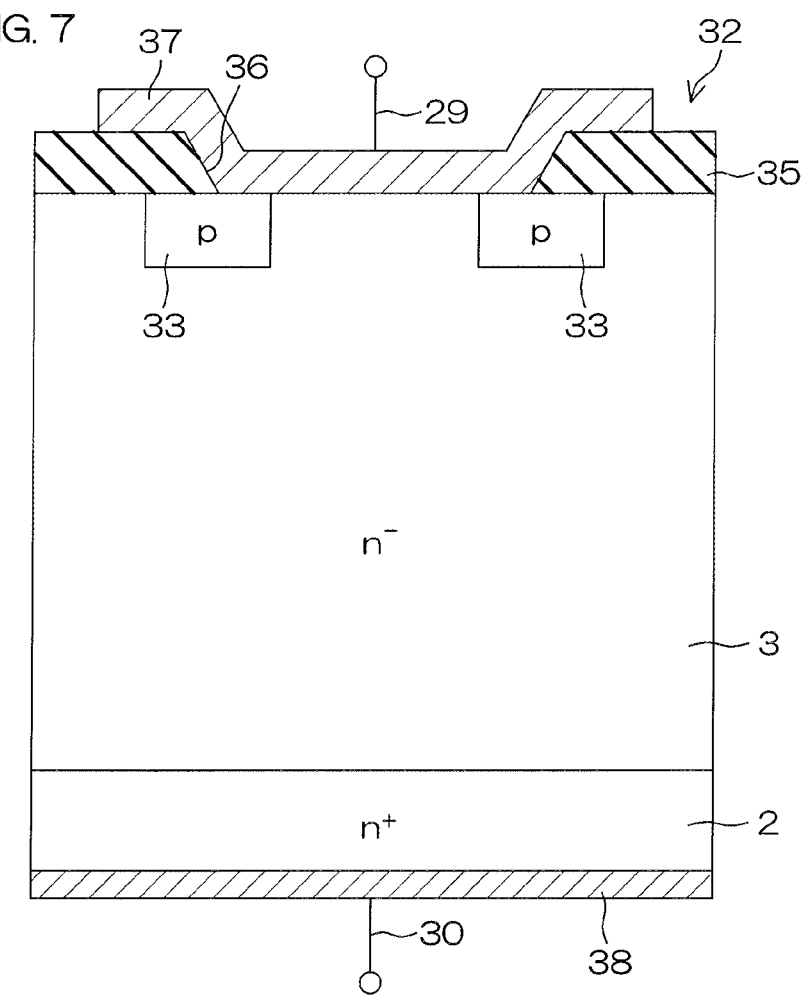

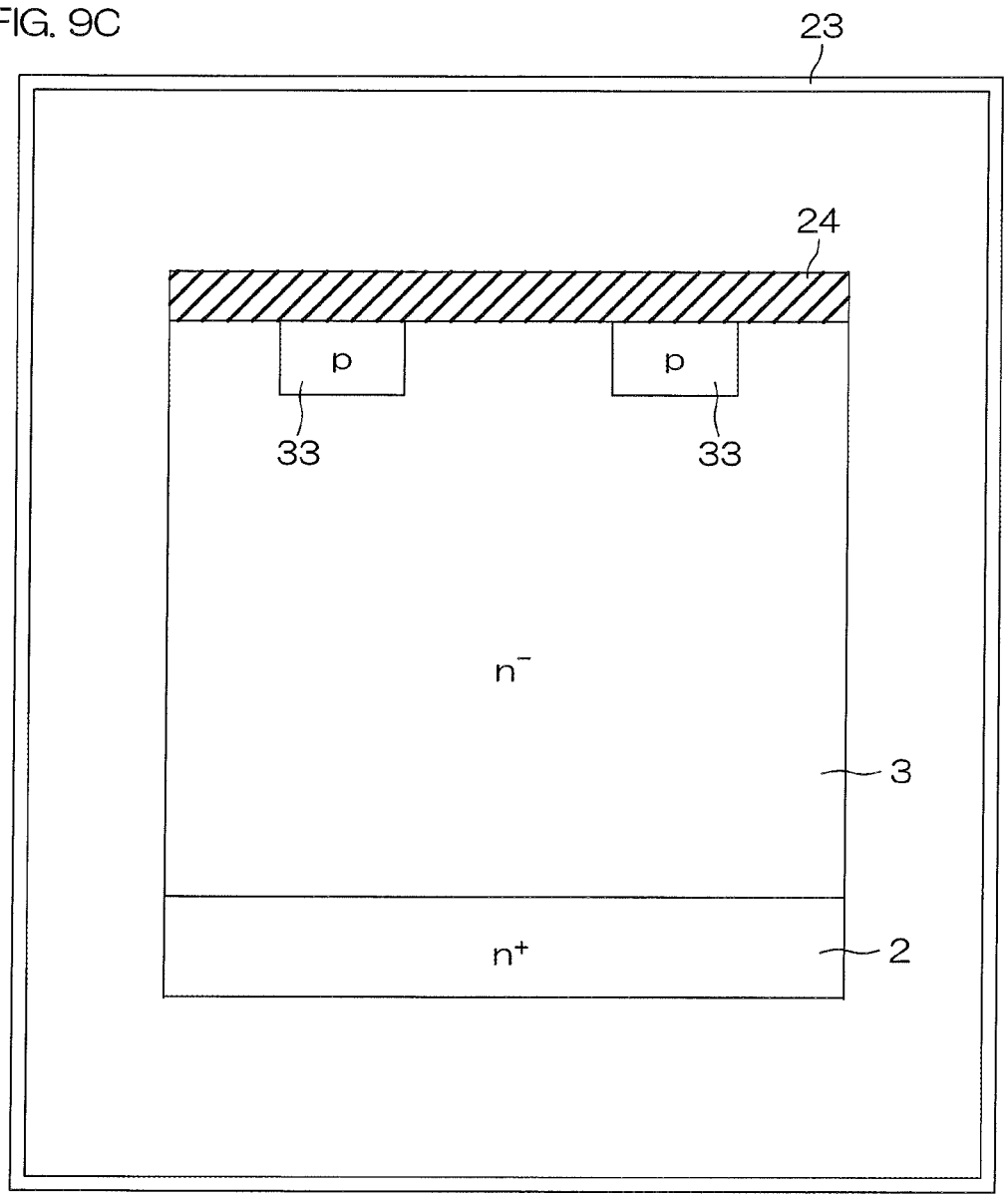

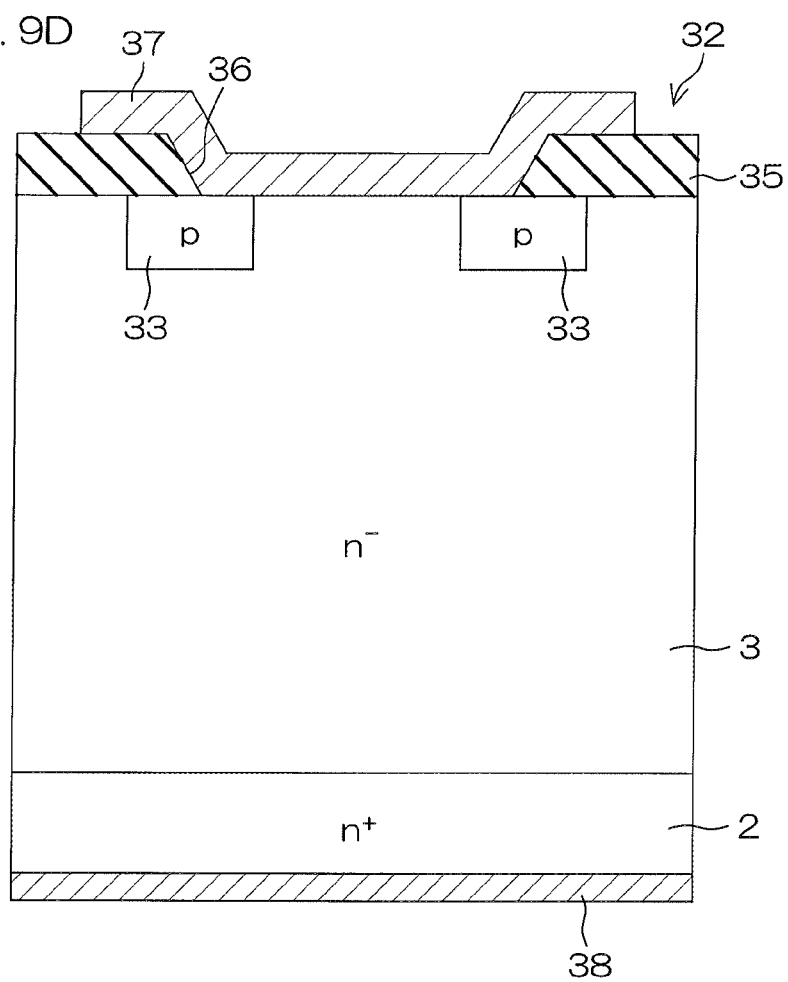

SEMICONDUCTOR DEVICE AND METHOD FOR MANUFACTURING THE SEMICONDUCTOR DEVICE

CROSS-REFERENCE TO RELATED APPLICATIONS

The present application corresponds to Japanese Patent Application No. 2013-107350 filed in the Japan Patent Office on May 21, 2013, and the entire disclosure of the application is incorporated herein by reference.

FIELD OF THE INVENTION

The present invention relates to a semiconductor device and a method for manufacturing the same.

BACKGROUND ART

It is necessary to perform heat treatment at about 1600° C. in order to activate (diffuse or recrystallize) impurity ions implanted in SiC. However, there is a problem that an SiC surface remarkably becomes rough because sublimation of atoms or migration of surface atoms occurs in the SiC surface during the heat treatment.

Such surface roughness lowers the channel mobility of MOSFETs formed on the SiC surface, and deteriorates a gate oxide film. Additionally, in a Schottky barrier diode, such surface roughness may cause an increase in reverse leakage current or may cause variations in forward characteristics.

A method for forming a carbon film on an SiC surface prior to an impurity ions activation has been proposed as one method for solving this problem.

Patent Literature 1 (Japanese Patent Application Publication No. 2005-353771) discloses a method for manufacturing an SiC semiconductor device that includes a step of implanting impurity ions partly into an n-type drift layer to form an ion-implanted layer, a step of forming a carbon film on the n-type drift layer and on the ion-implanted layer according to a sputtering method, and a step of annealing the n-type drift layer at a temperature of 1600° C. or more when the n-type drift layer and the ion-implanted layer are covered with the carbon film.

BRIEF SUMMARY OF THE INVENTION

However, disadvantageously, if the method of Patent Literature 1 is executed, the yield rate of the semiconductor device will be lowered, for example, by an increase of carbon particles in a heat treat furnace or by the occurrence of pinholes (holes) in the carbon film during the annealing.

Additionally, disadvantageously, a step of peeling off the carbon film must be performed many times because carbon residues are liable to remain at the peel-off step.

The object of the present invention is to provide a semiconductor device and a method for manufacturing the same that are capable of achieving cost reductions brought about by reducing the number of manufacturing process steps and capable of achieving excellent reliability while restraining a decrease in yield due to the roughness of an SiC surface.

BRIEF DESCRIPTION OF THE DRAWINGS

FIG. 7 is a schematic cross-sectional view of a semiconductor device according to a second preferred embodiment of the present invention.

FIG. 9A to FIG. 9D are views showing the manufacturing steps of the semiconductor device of FIG. 7.

DETAILED DESCRIPTION OF THE INVENTION

Figure 1:
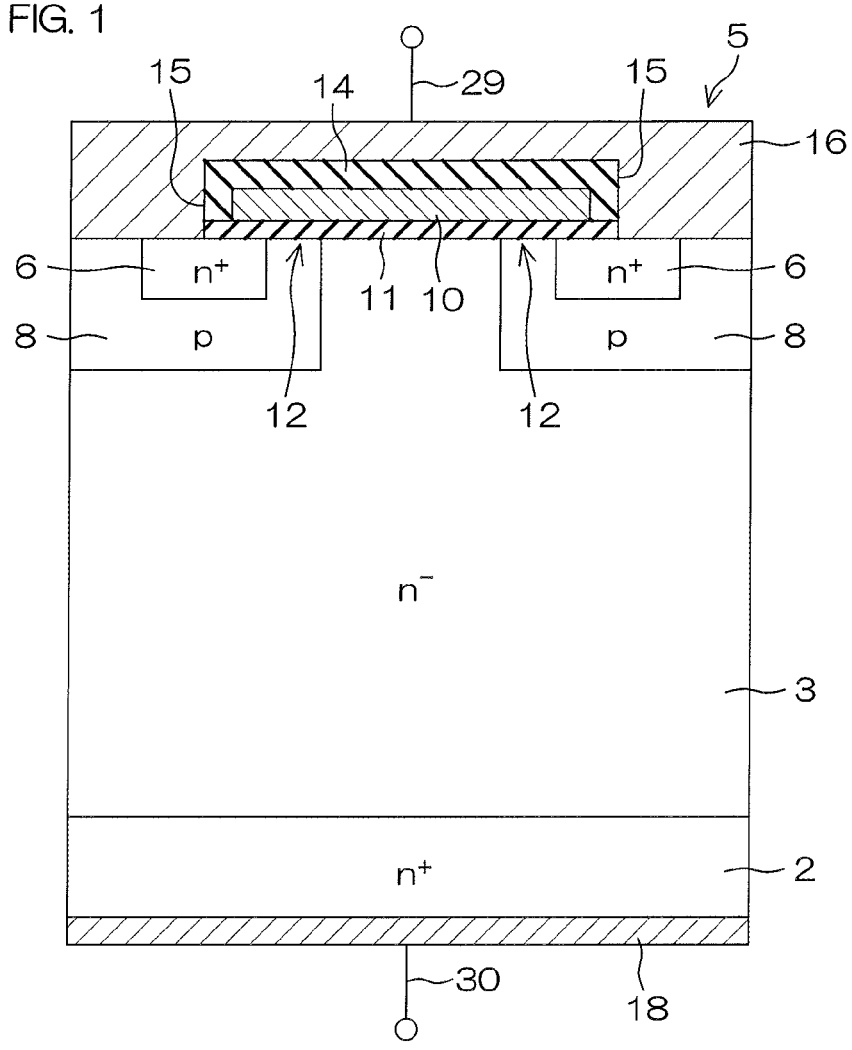
FIG. 1 is a schematic cross-sectional view of a semiconductor device according to a first preferred embodiment of the present invention.

A semiconductor-device manufacturing method of the present invention includes a step of selectively implanting impurity ions into a surface of an SiC semiconductor layer and forming impurity regions and a step of activating the impurity ions by annealing the SiC semiconductor layer at a temperature of 1400° C. or more when the surface of the SiC semiconductor layer is covered with an insulating film.

According to this method, the surface of the SiC semiconductor layer is covered with the insulating film when the impurity ions in the SiC semiconductor layer are activated, and therefore occurrence of the sublimation or migration of atoms in the surface of the SiC semiconductor layer can be reduced. As a result, it is possible to restrain the surface of the SiC semiconductor layer from being roughened, and a semiconductor device capable of realizing excellent reliability can be provided.

Additionally, according to this method, a carbon film is not required to be formed on the surface of the SiC semiconductor layer, and therefore it is possible to solve the problem of carbon particles or pinholes that occurs when a carbon film is employed to prevent the surface roughness of the SiC surface. Therefore, deterioration of the yield due to those problems can be prevented. Additionally, it is also possible to reduce the number of manufacturing steps because the problem of carbon residues does not arise.

The insulating film may include an oxide film.

The insulating film may be formed by a thermal oxidation using the heat for the impurity ions activation.

According to this method, it is possible to unite two steps consisting of the step of activating impurity ions and the step of forming the oxide film on the surface of the SiC semiconductor layer into a single step, and therefore it is possible to make the number of manufacturing steps even smaller.

The impurity ions may be activated in an atmosphere of a gas containing components comprising oxygen atoms.

According to this method, an oxide film on the surface of the SiC semiconductor layer can be formed efficiently, and it is possible to restrain the oxide film from vaporizing there during, and therefore it is possible to excellently maintain a state in which impurity regions are covered with the oxide film. As a result, it is possible to effectively restrain the surface of the SiC semiconductor layer from being roughened.

The gas may be NO or $N_2O$.

According to this method, it is possible to make the plane-orientation dependence of the $SiO_2$/SiC interface structure smaller than in a case in which an oxide film is formed on the surface of the SiC semiconductor layer by using only an oxygen gas. Therefore, it is possible to keep the surface of the SiC semiconductor layer, on which the oxide film has been formed, in a less roughened state and in an excellent state.

The gas may be a mixture with an inert gas.

According to this method, it is possible to reduce the concentration of the oxygen-atom containing gas in the atmosphere, and therefore it is possible to lower the oxidation rate of the surface of the SiC semiconductor layer. This makes it possible to perform heat treatment to activate impurity ions for a long time while preventing the surface of the SiC semiconductor layer from being excessively oxidized, and therefore it is possible to effectively activate the impurity ions. Additionally, it is also possible to restrain the heat treat furnace from being excessively oxidized.

The inert gas may be He or Ar.

He or Ar does not easily react chemically with the SiC semiconductor layer and with the heat treat furnace unlike $N_2$. When He or Ar is used as an inert gas, an oxide film can be stably formed on the surface of the SiC semiconductor layer while preventing the SiC semiconductor layer and the heat treat furnace from being nitrided.

The semiconductor-device manufacturing method may further include a wet etching step of, after the step of activating the impurity ions, removing the oxide film by use of an etchant.

According to this method, the oxide film is etched by use of an etchant, and therefore it is possible to restrain etching damage from occurring in the surface of the SiC semiconductor layer during removal of the oxide film.

The etchant may be a liquid containing HF (hydrofluoric acid).

HF has a comparatively fast etching rate with respect to the oxide film among liquids that are capable of etching the oxide film. Therefore, the processing time of etching can be shortened to even reduce production costs.

The semiconductor-device manufacturing method may further include a step of, after the step of activating the impurity ions, removing the oxide film by chemical dry etching.

According to this method, the oxide film is etched by use of chemical reactions, and therefore in the same way as in a case in which the aforementioned wet etching is performed, it is possible to restrain etching damage from occurring in the surface of the SiC semiconductor layer during removal of the oxide film.

The semiconductor-device manufacturing method may further include a step of, prior to the step of activating the impurity ions, forming the pretreatment oxide film on the surface of the SiC semiconductor layer.

According to this method, the surface of the SiC semiconductor layer has already been covered with the oxide film (pretreatment oxide film) when the step of activating the impurity ions is started, and therefore it is possible to restrain the sublimation or migration of atoms from occurring in the surface of the SiC semiconductor layer from immediately after starting the impurity ion activating step.

The pretreatment oxide film may be formed by a thermal oxidation under a gas containing components comprising oxygen atoms.

According to this method, a pretreatment oxide film on the surface of the SiC semiconductor layer can be formed efficiently, and it is possible to restrain the pretreatment oxide film from vaporizing there during.

The gas may be NO or $N_2O$.

According to this method, it is possible to make the plane-orientation dependence of the $SiO_2$/SiC interface structure smaller than in a case in which a pretreatment oxide film is formed on the surface of the SiC semiconductor layer by using only an oxygen gas. Therefore, it is possible to keep the surface of the SiC semiconductor layer, on which the pretreatment oxide film has been formed, in a less roughened state and in an excellent state.

The gas may be a mixture with an inert gas.

According to this method, it is possible to reduce the concentration of the oxygen-atom containing gas in the atmosphere, and therefore it is also possible to restrain an apparatus from being excessively oxidized.

The inert gas may be He or Ar.

He or Ar does not easily react chemically with the SiC semiconductor layer and with the apparatus unlike $N_2$. When He or Ar is used as an inert gas, a pretreatment oxide film can be stably formed on the surface of the SiC semiconductor layer while preventing the SiC semiconductor layer and the apparatus from being nitrided.

The pretreatment oxide film may be formed by a CVD method.

According to this method, it is possible to form a comparatively thick pretreatment oxide film.

The SiC semiconductor layer may include chemical elements other than Si (silicon) and C (carbon).

A semiconductor device of the present invention includes an SiC semiconductor layer and impurity regions selectively formed in the surface of the SiC semiconductor layer, and, in the semiconductor device, a carrier lifetime of the SiC semiconductor layer is 30 μsec or more.

It is possible to manufacture the SiC semiconductor layer (semiconductor device) having this carrier lifetime according to the semiconductor-device manufacturing method of the present invention.

A semiconductor element including the impurity regions may be formed in the SiC semiconductor layer.

According to this arrangement, the impurity ions have been excellently activated, and the semiconductor element is formed in the SiC semiconductor layer that has a less roughened surface, and therefore it is possible to provide a semiconductor device having excellent characteristics.

The semiconductor element may include a MOSFET.

According to this arrangement, it is possible to provide a MOSFET capable of realizing excellent channel mobility and capable of restraining a gate oxide film from deteriorating.

The semiconductor element may include a Schottky barrier diode.

According to this arrangement, it is possible to provide a Schottky barrier diode capable of reducing a reverse leakage current and capable of improving a forward characteristic.

Preferred embodiments of the present invention will be hereinafter described in detail with reference to the accompanying drawings.

FIG. 1 is a schematic cross-sectional view of a semiconductor device 1 according to a first preferred embodiment of the present invention. It should be noted that FIG. 1 is a schematic cross-sectional view that depicts a unit cell of a semiconductor element formed in the semiconductor device 1.

The semiconductor device 1 includes an $n^+$-type SiC substrate 2 and an $n^-$-type SiC epitaxial layer 3 formed on the SiC substrate 2. The impurity concentration of the SiC substrate 2 is, for example, $1.0 \times 10^{18}$ $cm^{-3}$ to $1.0 \times 10^{20}$ $cm^{-3}$, and the impurity concentration of the SiC epitaxial layer 3 is, for example, $5.0 \times 10^{14}$ cm$^{-3}$ to $5.0 \times 10^{16}$ cm$^{-3}$. N (nitrogen), As (arsenic), P (phosphorus), etc., can be mentioned as examples of n-type impurities.

The semiconductor device 1 includes a vertical MOSFET 5 (Metal-Oxide-Semiconductor Field-Effect Transistor) serving as an example of a semiconductor element. In the surface of the SiC epitaxial layer 3, the MOSFET 5 includes n$^+$-type source regions 6 selectively formed with an interval therebetween, p-type body regions 8 formed so as to surround the n$^+$-type source region 6, and a gate electrode 10 formed on the SiC epitaxial layer 3 with a gate oxide film 11 therebetween. Although only one pair of n$^+$-type source regions 6 and only one pair of p-type body regions 8 are shown in FIG. 1, many regions 6 and 8 may be arranged, for example, in a stripe manner or in a matrix manner on the SiC epitaxial layer 3.

The impurity concentration of the n$^+$-type source region 6 is, for example, $1.0 \times 10^{17}$ cm$^{-3}$ to $1.0 \times 10^{20}$ cm$^{-3}$, and the impurity concentration of the p-type body region 8 is, for example, $1.0 \times 10^{16}$ cm$^{-3}$ to $1.0 \times 10^{19}$ cm$^{-3}$. B (boron), Al (aluminum), etc., can be mentioned as examples of p-type impurities. The region around each p-type body region 8 is a channel region 12 that surrounds the n$^+$-type source region 6. The channel formation in the channel region 12 is controlled by the gate electrode 10.

The gate electrode 10 is formed on the SiC epitaxial layer 3 with the gate oxide film 11 therebetween so as to be placed on the mutually-adjacent p-type body regions 8 like a bridge. The gate oxide film 11 is formed more widely than the gate electrode 10. An interlayer insulating film 14 is formed on the gate oxide film 11 so as to cover the gate electrode 10 therewith.

Contact holes 15 by which the n$^+$-type source region 6 and the p-type body region 8 are selectively exposed are formed in the interlayer insulating film 14. A source electrode 16 is formed so as to cover the interlayer insulating film 14 therewith by backfilling the contact hole 15 therewith. In other words, the source electrode 16 enters the contact hole 15, and is connected to the n$^+$-type source region 6. The source electrode 16 is connected to an upper wiring 29.

On the other hand, a drain electrode 18 is formed on a back surface of the SiC substrate 2. The drain electrode 18 is connected to a back wiring 30. The semiconductor device 1 provided with the vertical MOSFET 5 is formed in this way.

Next, a method for manufacturing the semiconductor device 1 will be described with reference to FIG. 2 and FIGS. 3A to 3F.

Figure 2:
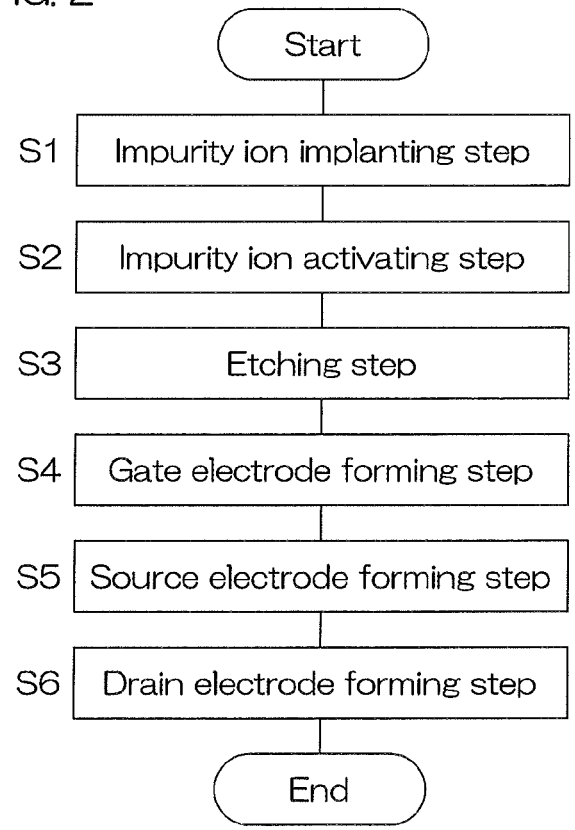
FIG. 2 is a flow chart of manufacturing steps of the semiconductor device of FIG. 1.

FIG. 2 is a flow chart of manufacturing steps of the semiconductor device 1 of FIG. 1, and FIG. 3A to FIG. 3F are views showing the manufacturing steps of the semiconductor device 1.

Figure 3A:
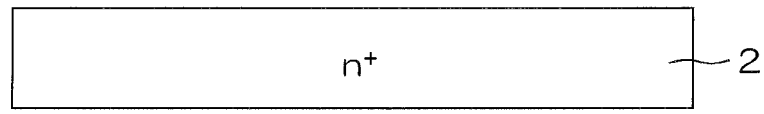
FIG. 3A to FIG. 3F are views showing the manufacturing steps of the semiconductor device of FIG. 1.
Figure 3B:
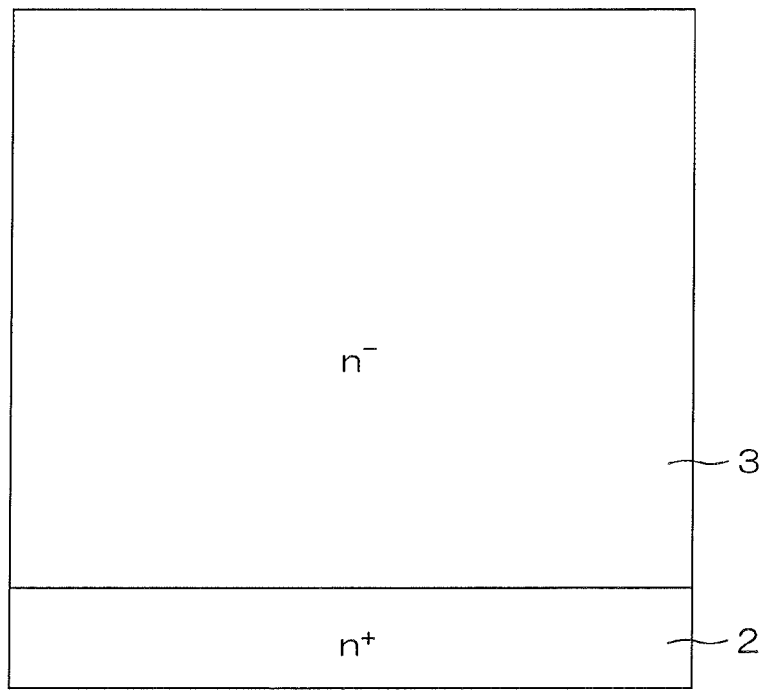

An n$^+$-type SiC substrate 2 is prepared to manufacture the semiconductor device 1 as shown in, for example, FIG. 3A. Thereafter, as shown in FIG. 3B, SiC is subjected to epitaxial growth while implanting n-type impurity ions thereinto, and an n$^-$-type SiC epitaxial layer 3 is formed on the SiC substrate 2.

Thereafter, a step of selectively implanting impurity ions into a surface of the SiC epitaxial layer 3 is performed (S1: Impurity ion implanting step). An ion implanting mask (not shown) that selectively has an opening in a region to form the p-type body region 8 is first formed on the surface of the SiC epitaxial layer 3. P-type impurity ions are then implanted into the SiC epitaxial layer 3 through the ion implanting mask (not shown). As a result, the p-type body region 8 is formed. Thereafter, the ion implanting mask (not shown) is removed.

Figure 3C:
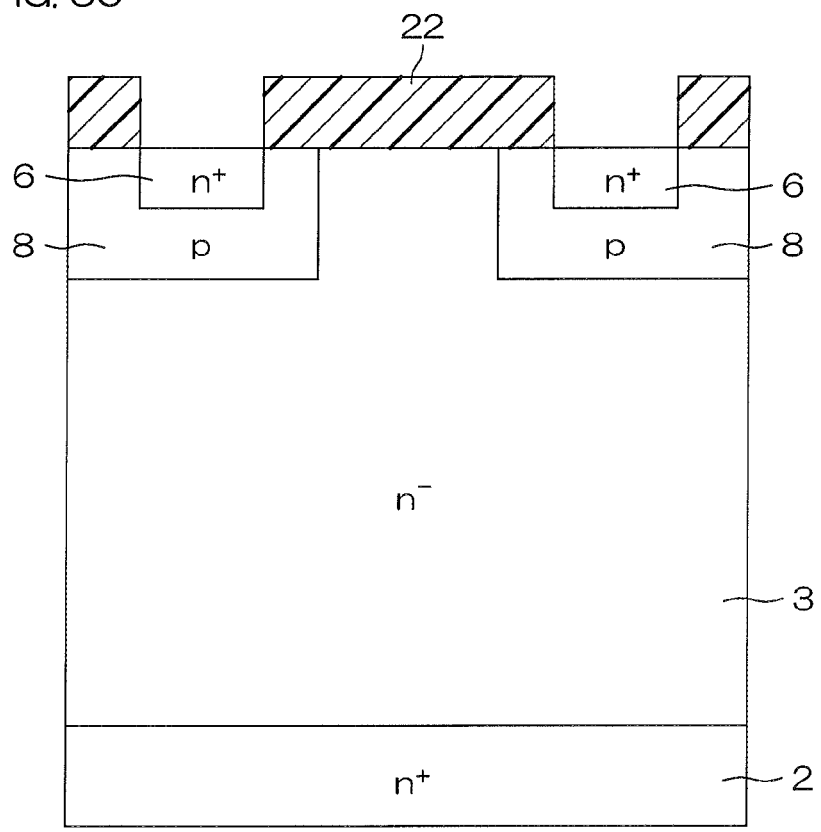
Figure 3D:
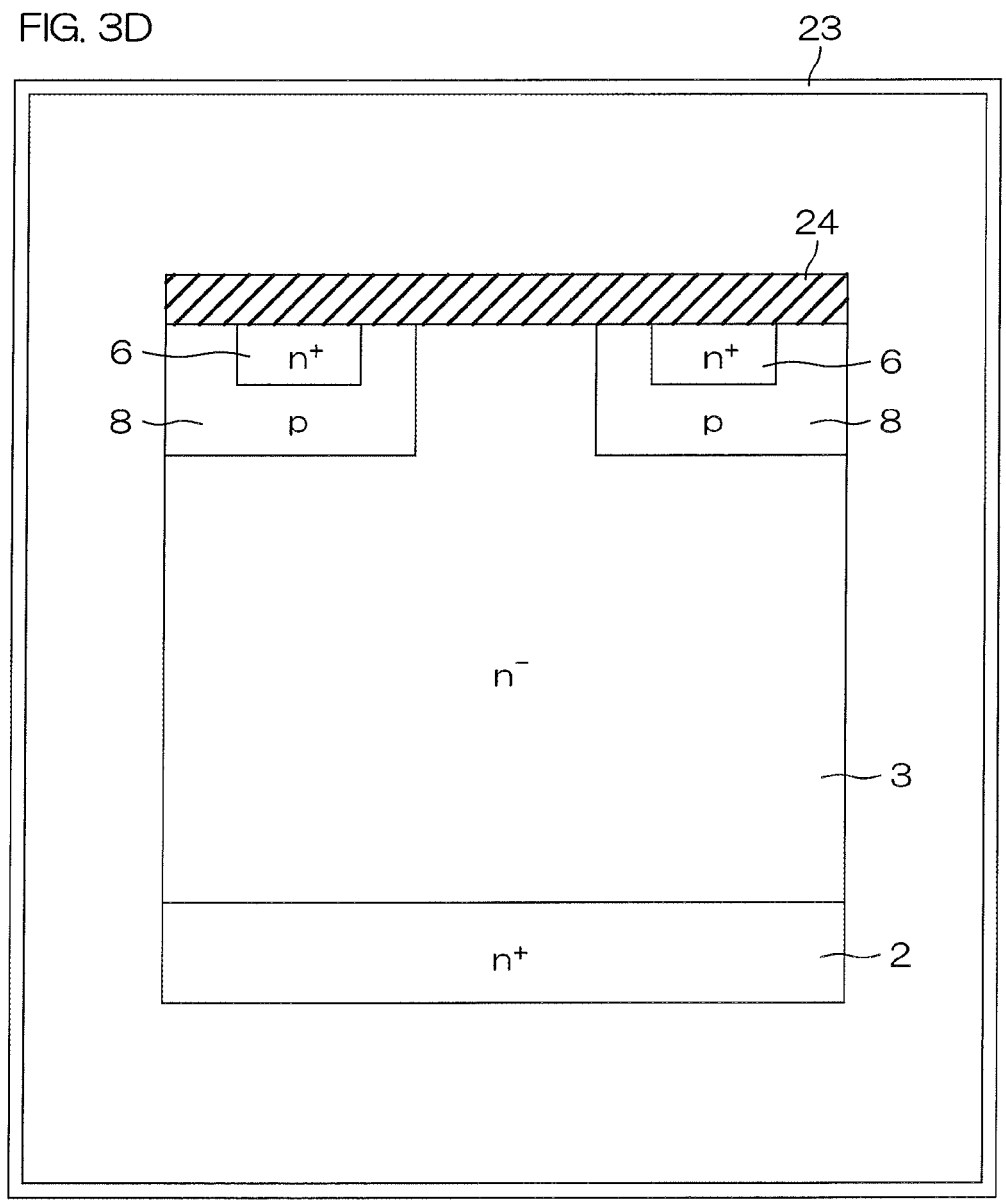

Thereafter, as shown in FIG. 3C, an ion implanting mask 22 that selectively has an opening in a region to form the n$^+$-type source region 6 is formed on the surface of the SiC epitaxial layer 3. N-type impurity ions are then implanted into the SiC epitaxial layer 3 through the ion implanting mask 22. As a result, the n$^+$-type source region 6 is formed. Thereafter, the ion implanting mask 22 is removed, and the SiC substrate 2 is placed in a heat treat furnace 23 as shown in FIG. 3D.

After the SiC substrate 2 is placed in the heat treat furnace 23, the SiC substrate 2 (the SiC epitaxial layer 3) is annealed at a temperature of 1400° C. or more in a gas atmosphere containing components including oxygen atoms. This annealing (heat treatment) activates the impurity ions in the SiC epitaxial layer 3, and, as a result, a thermally-oxidized film 24 is formed on the surface of the SiC epitaxial layer 3 (S2: Impurity ion activating step).

Specifically, temperature conditions of the heat treat furnace 23 at the impurity ion activating step (S2) are as follows. In detail, the heat treat furnace 23 is heated to a temperature of 1400° C. or more at a temperature-rise speed of 50° C./min or more and, preferably, at a temperature-rise speed of 100° C./min to 200° C./min. Preferably, at this time, the temperature of the heat treat furnace 23 is 1600° C. to 1800° C.

The SiC substrate 2 is continuously subjected to heat treatment at a temperature of 1600° C. to 1800° C. for 1 minute to 30 minutes. Thereafter, the heat treat furnace 23 is cooled to 800° C. at a temperature-fall speed of 100° C./min to 200° C./min.

This impurity ion activating step (S2) is performed in a gas atmosphere including oxygen atoms, and therefore oxygen atoms are continuously supplied to the surface of the SiC epitaxial layer 3. This makes it possible to reliably form the thermally-oxidized film 24 on the surface of the SiC epitaxial layer 3, and makes it possible to restrain the thermally-oxidized film 24 from vaporizing. Preferably, this thermally-oxidized film 24 is formed to have a film thickness of, for example, 0.05 μm to 0.1 μm. After the impurity ion activating step (S2) is completed, the SiC substrate 2 is taken out from the heat treat furnace 23.

Thereafter, the thermally-oxidized film 24 formed on the surface of the SiC epitaxial layer 3 is removed by etching (S3: Etching step). The thermally-oxidized film 24 formed on the surface of the SiC epitaxial layer 3 may be removed by wet etching or by chemical dry etching.

Preferably, an etchant that contains HF (hydrofluoric acid) is used if wet etching is employed. In liquids that are capable of etching the thermally-oxidized film 24, HF has a comparatively fast etching rate with respect to the thermally-oxidized film 24. Therefore, it is possible to reduce production costs while shortening the processing time of etching.

Likewise, if chemical dry etching is employed, the thermally-oxidized film 24 is etched by chemical reactions, and therefore it is possible to restrain etching damage from occurring in the surface of the SiC epitaxial layer 3, in the same way as in the wet etching mentioned above, when the thermally-oxidized film 24 is removed.

Figure 3E:
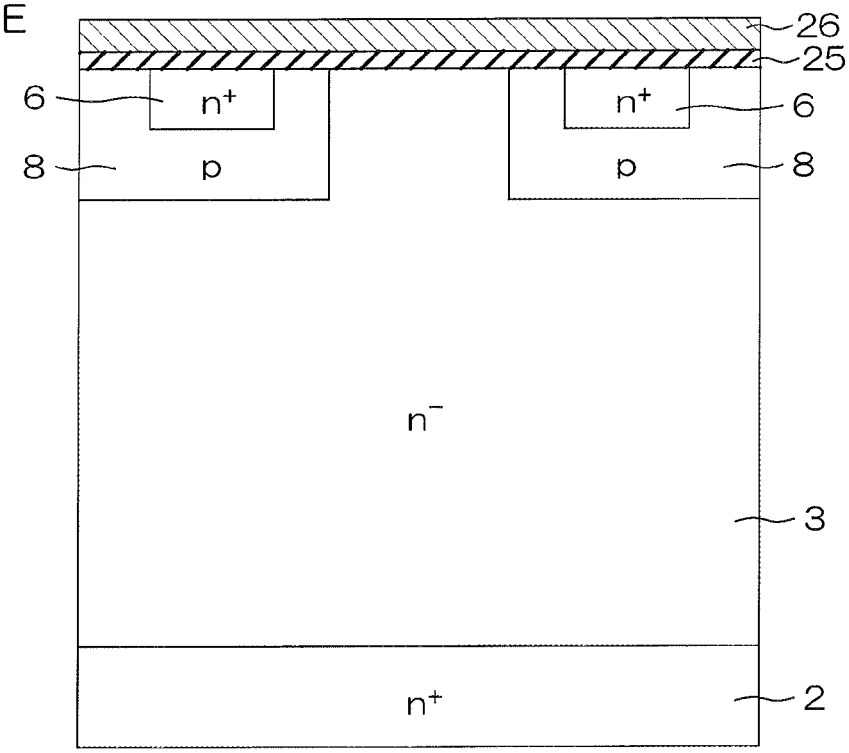

Thereafter, as shown in FIG. 3E, a polysilicon layer 26 in which impurity ions have been implanted is formed on a thin oxide film 25 formed by oxidizing the surface of the SiC epitaxial layer 3. Thereafter, a hard mask (not shown) with which a region to form the gate electrode 10 is covered is selectively formed on the polysilicon layer 26, and an unnecessary part of the polysilicon layer 26 is etched. As a result, the gate electrode 10 is formed (S4: Gate electrode forming step). After the gate electrode 10 is formed, the hard mask (not shown) is removed.

Figure 3F:
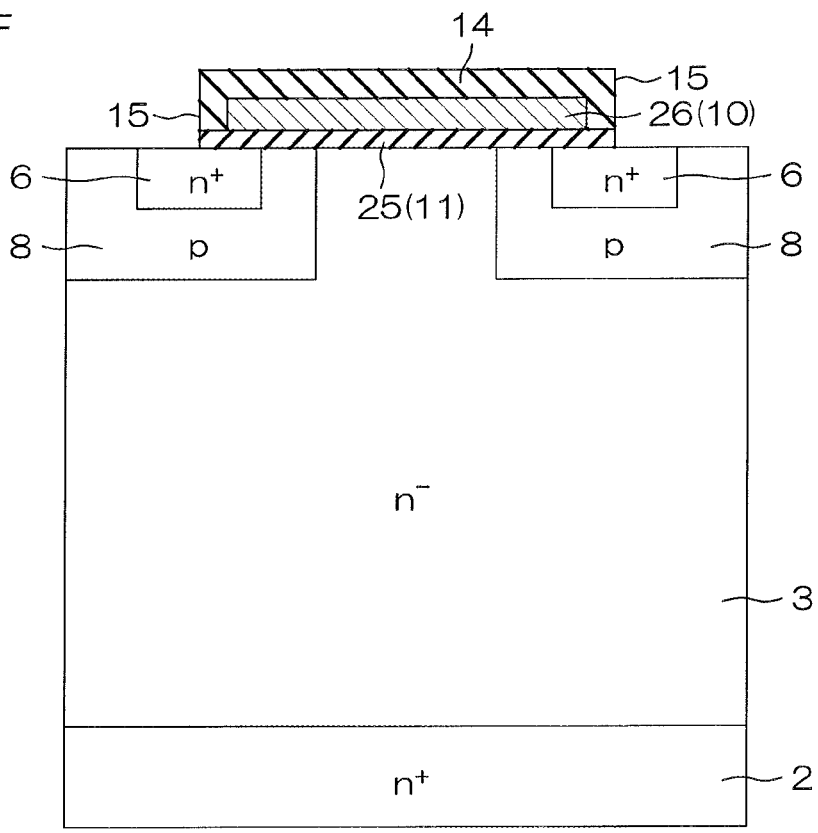

Thereafter, the interlayer insulating film 14 is formed on the thin oxide film 25 so as to completely cover the gate electrode 10 therewith. Thereafter, a hard mask (not shown) that selectively has an opening in a region to form the contact hole 15 is formed on the interlayer insulating film 14. Thereafter, the interlayer insulating film 14 and the thin oxide film 25 are etched through the hard mask (not shown), and the contact hole 15 by which the $n^+$-type source region 6 and the p-type body region 8 are selectively exposed is formed as shown in FIG. 3F. At this time, the gate electrode 10 is arranged to be formed on the SiC epitaxial layer 3 with the gate oxide film 11 (the thin oxide film 25) therebetween. After the contact hole 15 is formed, the hard mask (not shown) is removed.

Thereafter, the contact hole 15 is backfilled, and the source electrode 16 is formed so as to cover the interlayer insulating film 14 (S5: Source electrode forming step). Thereafter, the drain electrode 18 is formed on the back surface of the SiC substrate 2 (S6: Drain electrode forming step).

Thereafter, the upper wiring 29 and the back wiring 30 are connected to the source electrode 16 and the drain electrode 18, respectively. Prior to the drain electrode forming step (S6), a passivation film may be formed so as to cover the source electrode 16 therewith. The semiconductor device 1 shown in FIG. 1 can be obtained through the steps mentioned above.

Next, referring again to FIG. 3D, a description will be given of conditions of gases that contain oxygen atoms to be supplied to the heat treat furnace 23 at the impurity ion activating step (S2).

Specifically, a gas that contains $O_2$, NO, or $N_2O$ can be used as a gas including oxygen atoms. Preferably, the oxygen-atom containing gas is NO or $N_2O$ among those gases. In this case, the plane-orientation dependence of the structure of an interface ($SiO_2$/SiC interface) between the thermally-oxidized film 24 and the SiC epitaxial layer 3 can be made smaller than in a case in which the thermally-oxidized film 24 is formed on the surface of the SiC epitaxial layer 3 by using only an oxygen gas. Therefore, the surface of the SiC epitaxial layer 3 on which the thermally-oxidized film 24 has been formed can be kept in a less roughened state and in an excellent state.

The oxygen-atom containing gas may be a mixed gas that additionally contains an inert gas. A gas that contains He, Ar, or $N_2$ can be used as the inert gas. Preferably, the inert gas is He or Ar among those gases. Unlike $N_2$, in this case, He and Ar do not easily react chemically with the SiC epitaxial layer 3 and with the heat treat furnace 23, and therefore the thermally-oxidized film 24 can be stably formed on the surface of the SiC epitaxial layer 3 while preventing the SiC epitaxial layer 3 and the heat treat furnace 23 from being nitrided.

Although it is preferable for the content ratio of He or Ar to fall within, for example, 99.9% to 90% with respect to an oxygen-atom containing gas, this content ratio can be appropriately changed in accordance with the film thickness of a thermally-oxidized film 24 to be formed.

When a mixed gas that contains an inert gas is used, the concentration of the oxygen-atom containing gas in an atmosphere can be thus lowered, and therefore the oxidation rate of the surface of the SiC epitaxial layer 3 can be lowered. This makes it possible to perform the impurity ion activating step (S2) for a long time while preventing the surface of the SiC epitaxial layer 3 from being excessively oxidized. As a result, it is possible to effectively activate impurity ions implanted in the SiC epitaxial layer 3 while forming the thermally-oxidized film 24 on the surface of the SiC epitaxial layer 3. Additionally, it is also possible to restrain the heat treat furnace 23 from being excessively oxidized.

As described above, in the manufacturing method according to the first preferred embodiment of the present invention, the impurity ions implanted in the SiC epitaxial layer 3 are activated, and the thermally-oxidized film 24 is formed on the surface of the SiC epitaxial layer 3, and therefore it is possible to restrain the sublimation or migration of atoms from occurring in the surface of the SiC epitaxial layer 3. This makes it possible to excellently activate impurity ions and makes it possible to form the SiC epitaxial layer 3 whose surface is less roughened. As a result, it is possible to provide a semiconductor device 1 capable of realizing excellent reliability.

Additionally, a carbon film is not required to be formed on the surface of the SiC epitaxial layer 3, and therefore it is possible to solve the problem of carbon particles or pinholes that occurs when a carbon film is employed to prevent the surface roughness of the SiC epitaxial layer 3. Therefore, it is also possible to restrain the yield from falling caused by those problems. Additionally, it is also possible to reduce the number of manufacturing steps because the problem of carbon residues does not arise.

Figure 4:
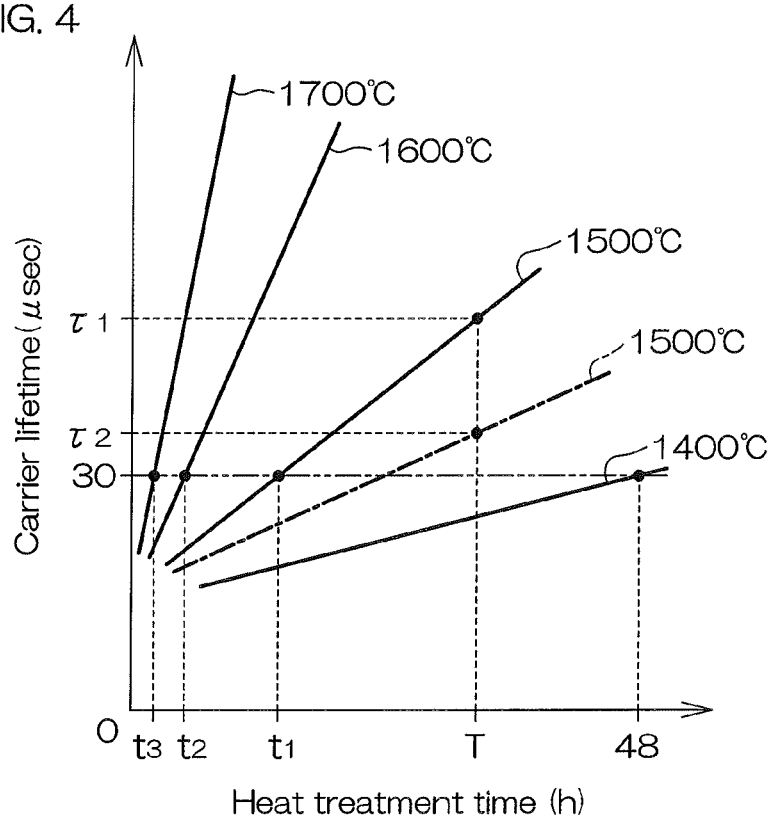
FIG. 4 is a graph to describe the carrier lifetime of the semiconductor device of FIG. 1.

Additionally, the carrier lifetime of the SiC epitaxial layer 3 formed through the manufacturing steps of FIGS. 3A to 3F mentioned above (hereinafter, referred to as the carrier lifetime of the semiconductor device 1) has been examined, and a result shown in FIG. 4 has been obtained. FIG. 4 illustrates, in the form of a graph, the carrier lifetime of the semiconductor device 1 that is a result obtained when the step (S2: impurity ion activating step) of activating impurity ions in a gas atmosphere containing $O_2$, NO, or $N_2O$ is performed in a state in which $SiO_2$ is not formed on the surface of the SiC epitaxial layer 3.

FIG. 4 is a graph to describe the carrier lifetime of the semiconductor device 1 of FIG. 1. In FIG. 4, the abscissa axis represents a heat treatment time (h: time), and the ordinate axis represents a carrier lifetime (μsec: μ seconds).

Each straight line shown by the solid line represents a relationship between the heat treatment time and the carrier lifetime of the semiconductor device 1 when the impurity ion activating step (S2) is performed by setting the temperature of the heat treat furnace 23 at 1400° C., 1500° C., 1600° C., and 1700° C. On the other hand, the straight line shown by the alternate long and short dashed line represents a relationship between the heat treatment time and the carrier lifetime of a semiconductor device (hereinafter, referred to as a "conventional semiconductor device") that has been manufactured by a conventional manufacturing method including a carbon-film forming step. The temperature condition of the heat treat furnace 23 according to the straight line shown by the alternate long and short dashed line is 1500° C. The position in which the carrier lifetime is 30 μsec is shown by the alternate long and two short dashed line.

With reference to each straight line shown by the solid line in FIG. 4, it is understood that, in each straight line, the carrier lifetime becomes longer in proportion to an increase in the heat treatment time. Likewise, it is understood that the carrier lifetime becomes longer in proportion to an increase in the temperature of the heat treat furnace 23 in the same heat treatment time.

More specifically, the graph in which the temperature is 1400° C. shows that the carrier lifetime is 30 μsec in a heat treatment time of about 48 hours, whereas the graph in which the temperature is 1500° C. shows that the carrier lifetime to be obtained is 30 μsec or more in a heat treatment time $t_1$ ($t_1$<48 hours) shorter than when the temperature is 1400° C. The graph in which the temperature is 1600° C. and 1700° C.

shows that the carrier lifetime to be obtained is 30 μsec or more in heat treatment times $t_2$ and $t_3$ ($t_3 < t_2 < t_1$) shorter than when the temperature is 1500° C. In other words, it is possible to say that the heat treatment time can be made shorter in proportion to an increase in the temperature of the heat treat furnace 23 and that an excellent carrier lifetime can be obtained.

Next, a comparison is made between the carrier lifetime of the semiconductor device 1 when the temperature of the heat treat furnace 23 is 1500° C. and the carrier lifetime of the conventional semiconductor device. In FIG. 4, from comparing both the carrier lifetimes with each other in an arbitrary heat treatment time T, it has been found that the carrier lifetime of the conventional semiconductor device is $\tau_2$ and that the carrier lifetime of the semiconductor device 1 is $\tau_1$ ($\tau_1 > \tau_2$) whose value is greater than that of $\tau_2$.

The carrier lifetime of the semiconductor device 1 is achieved by the following principle. In detail, when the thermally-oxidized film 24 is formed on the surface of the SiC epitaxial layer 3 at the impurity ion activating step (S2) (see FIG. 3D), C (carbons) contained in the SiC epitaxial layer 3 diffuse from the surface of the SiC epitaxial layer 3 in the depth direction. As a result, C holes generated in the SiC epitaxial layer 3 are filled with diffused carbons, and therefore the $Z_{1/2}$ level that is a main carrier-lifetime limiting defect of the SiC epitaxial layer 3 is lowered. As a result, the carrier lifetime of the semiconductor device 1 increases. The diffusion velocity of C becomes higher in proportion to an increase in the temperature of the heat treat furnace 23 at the impurity ion activating step (S2), and therefore a semiconductor device 1 that has a more excellent carrier lifetime in a shorter heat treatment time can be obtained by heightening the temperature of the heat treat furnace 23.

In the manufacturing method of the present invention, it is possible to increase the carrier lifetime of the semiconductor device 1 based on the aforementioned principle, and therefore it is possible to obtain a more excellent carrier lifetime than in the conventional manufacturing method including the carbon-film forming step.

From the aforementioned results, it is possible to manufacture the semiconductor device 1 having an excellent carrier lifetime while shortening the step time of the impurity ion activating step (S2) according to the manufacturing method of the present invention. Additionally, it is possible to manufacture the semiconductor device 1 having an excellent carrier lifetime while greatly reducing the heat treatment time (step time of the impurity ion activating step (S2)) by setting the temperature of the heat treat furnace 23 at a higher degree (for example, at 1400° C. or more).

Therefore, according to the arrangement of the semiconductor device 1, it is possible to provide a MOSFET 5 capable of realizing excellent channel mobility and capable of restraining the gate oxide film 11 from deteriorating.

Next, with reference to FIG. 5 to FIG. 6B, a description will be given of a modification of the manufacturing steps of the semiconductor device 1 according to the first preferred embodiment described above.

Figure 5:
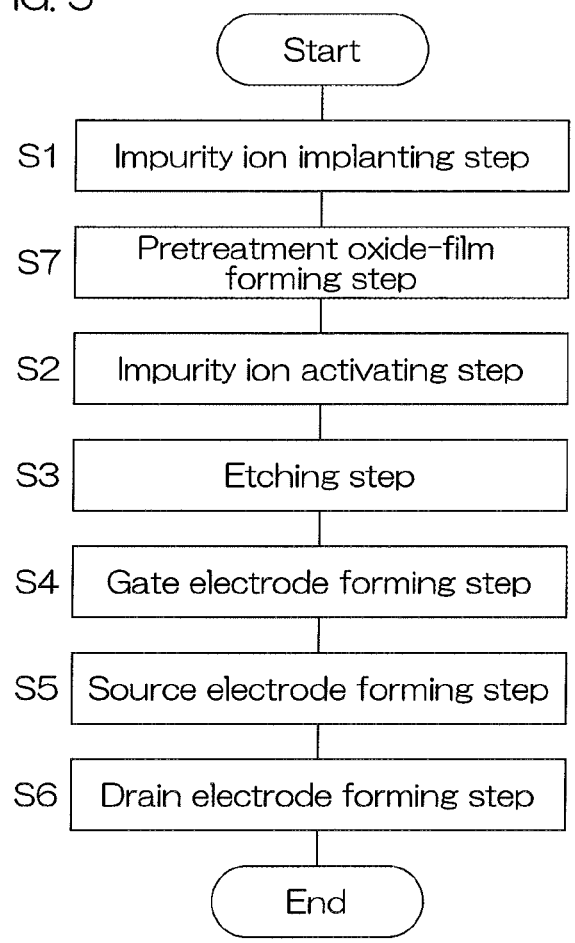
FIG. 5 is a flow chart of a modification of the manufacturing steps of FIG. 2.
Figure 6A:
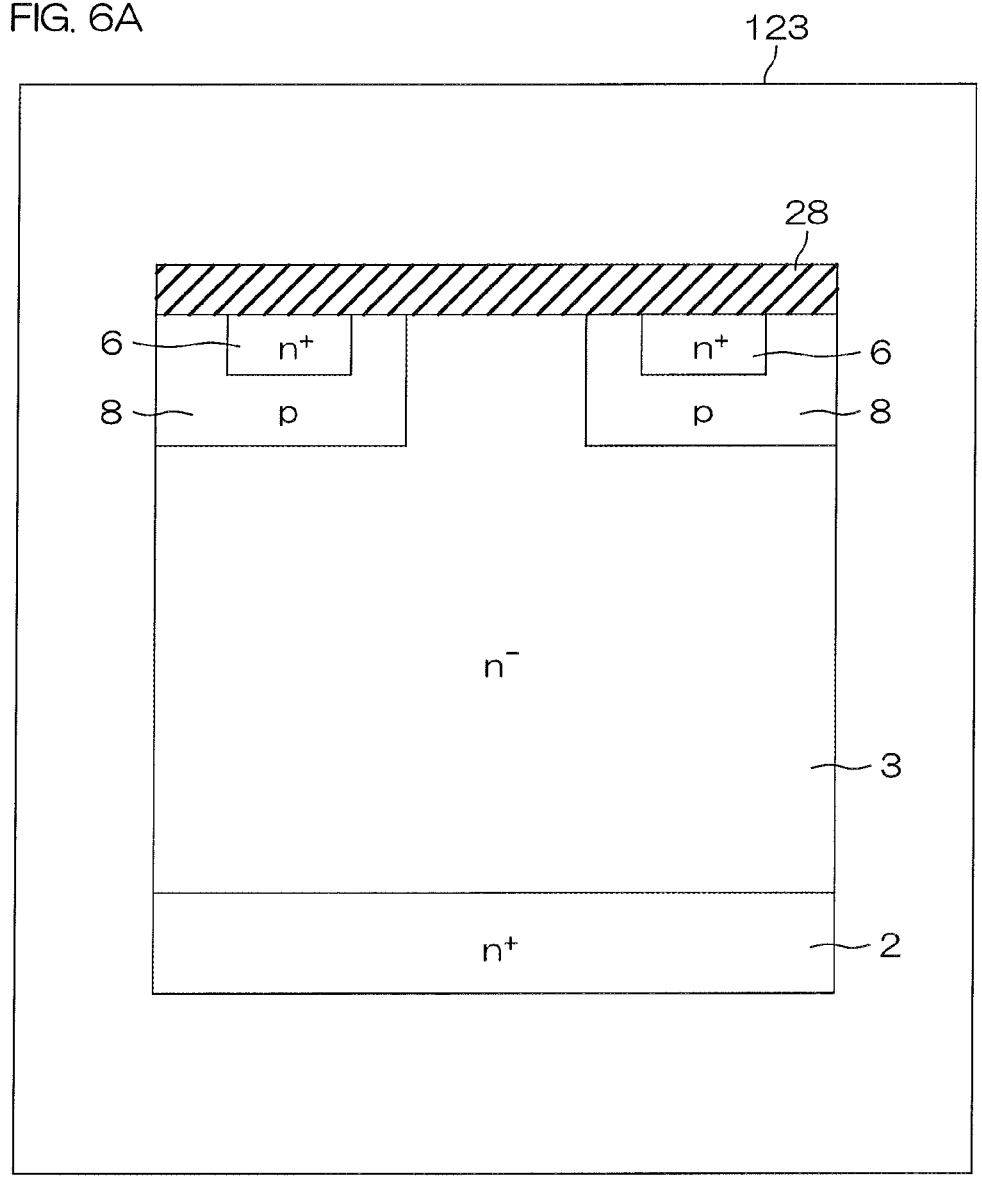
FIG. 6A and FIG. 6B are views showing the manufacturing steps of the semiconductor device of FIG. 5.

FIG. 5 is a flow chart of a modification of the manufacturing steps of FIG. 2. FIG. 6A and FIG. 6B are views that show manufacturing steps of the semiconductor device 1 of FIG. 5.

The manufacturing steps of the semiconductor device 1 according to FIG. 5 differ from the aforementioned manufacturing steps of the semiconductor device 1 according to FIG. 2 in the fact that a pretreatment oxide-film forming step (S7) is added prior to the impurity ion activating step (S2). The other steps are the same as in FIG. 2. In FIG. 5 to FIG. 6B, the same reference sign is given to a component equivalent to each component shown in FIG. 1 to FIG. 3F mentioned above, and a description of the component equivalent thereto is omitted.

In the manufacturing steps of the semiconductor device 1 according to the modification of the first preferred embodiment, a pretreatment oxide film 28 is formed on the surface of the SiC epitaxial layer 3 prior to the impurity ion activating step (S2) as shown in FIG. 6A (S7: Pretreatment oxide-film forming step).

The pretreatment oxide film 28 is formed by applying thermal oxidation treatment to the surface of the SiC epitaxial layer 3 in a diffusion furnace 123. The pretreatment oxide-film forming step (S7) is performed, for example, in a gas atmosphere containing oxygen atoms at a temperature of 1100° C. to 1350° C. Preferably, the film thickness of the pretreatment oxide film 28 to be formed is set at, for example, 0.05 μm to 0.1 μm at this time, and, however, the film thickness can be appropriately changed without being limited to these values.

The pretreatment oxide-film forming step (S7) is thus performed in the gas atmosphere containing oxygen atoms, and therefore it is possible to efficiently form the pretreatment oxide film 28 on the surface of the SiC epitaxial layer 3 and to restrain the pretreatment oxide film 28 formed thereon from vaporizing.

Figure 6B:
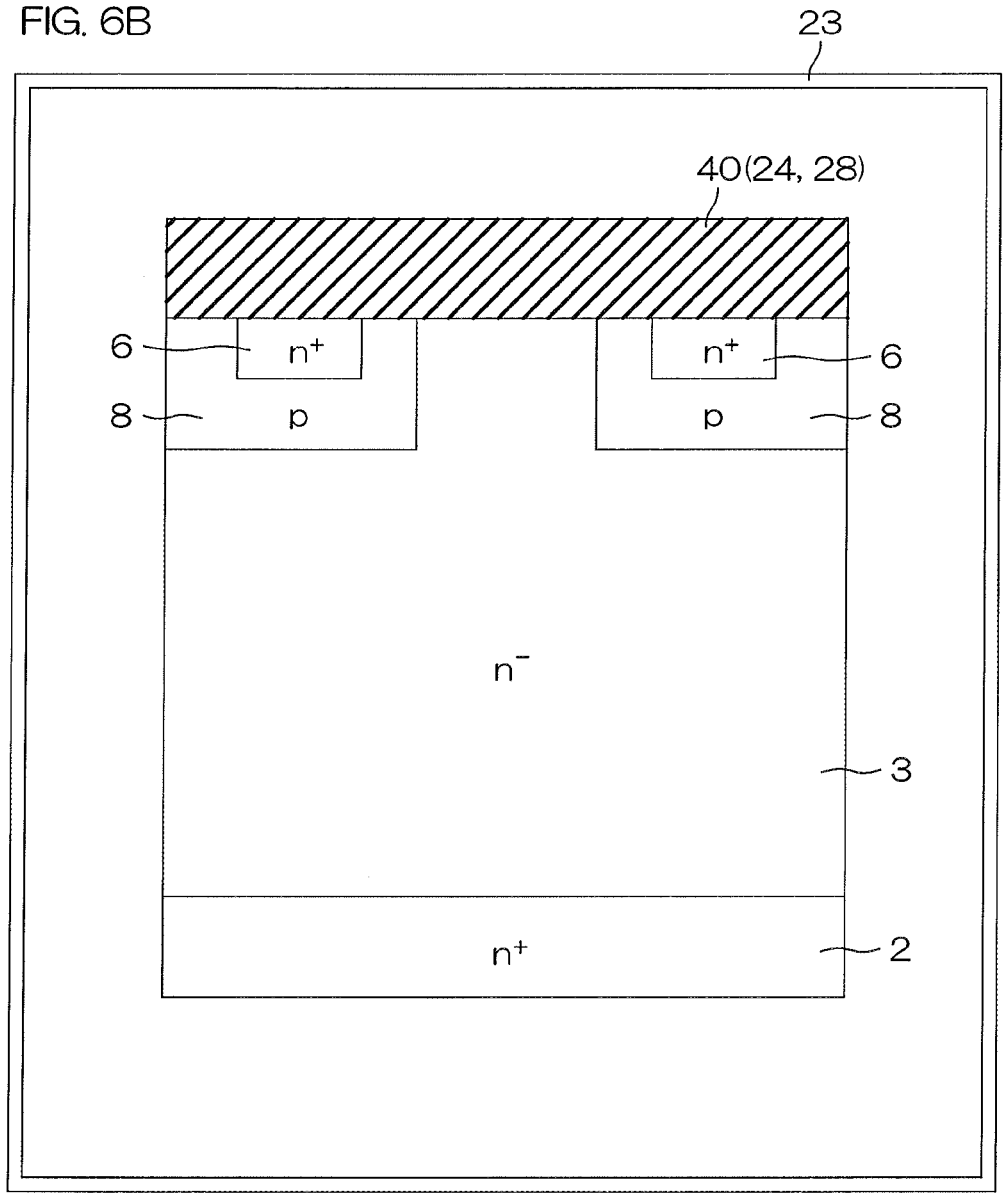

After completing the pretreatment oxide-film forming step (S7), the SiC substrate 2 is placed in the heat treat furnace 23 as shown in FIG. 6B. After placing the SiC substrate 2 in the heat treat furnace 23, the impurity ion activating step (S2) is applied to the SiC substrate 2 (the SiC epitaxial layer 3) under the same conditions as in the first preferred embodiment mentioned above.

At the impurity ion activating step (S2), impurity ions implanted in the SiC epitaxial layer 3 are activated, and oxygen atoms are continuously supplied to the surface of the SiC epitaxial layer 3 (to the pretreatment oxide film 28), and therefore the surface of the SiC epitaxial layer 3 is further oxidized, and the thermally-oxidized film 24 is formed. As a result, a composite oxide film 40 that unitedly includes the thermally-oxidized film 24 and the pretreatment oxide film 28 is formed on the surface of the SiC epitaxial layer 3.

After completing the impurity ion activating step (S2), the process ranging from the etching step (S3) to the drain electrode forming step (S6) is performed in this order in the same way as in the first preferred embodiment mentioned above, and the semiconductor device 1 is manufactured.

Next, referring again to FIG. 6A, a description will be given of conditions of an oxygen-atom containing gas supplied to the diffusion furnace 123 at the pretreatment oxide-film forming step (S7).

Specifically, a gas that contains $O_2$, NO, or $N_2O$ can be used as the oxygen-atom containing gas at the pretreatment oxide-film forming step (S7). Preferably, the oxygen-atom containing gas is NO or $N_2O$ among those gases. In this case, the plane-orientation dependence of the structure of an interface ($SiO_2$/SiC interface) between the pretreatment oxide film 28 and the SiC epitaxial layer 3 can be made smaller than in a case in which the pretreatment oxide film 28 is formed on the surface of the SiC epitaxial layer 3 by using only an oxygen gas.

The oxygen-atom containing gas may be a mixed gas that additionally contains an inert gas. A gas that contains He, Ar, or $N_2$ can be used as the inert gas. Preferably, the inert gas is He or Ar among those gases. Unlike $N_2$, in this case, He and Ar do not easily react chemically with the SiC epitaxial layer 3 and with the diffusion furnace 123, and therefore the pretreatment oxide film 28 can be stably formed on the surface of the SiC epitaxial layer 3 while preventing the SiC epitaxial layer 3 and the diffusion furnace 123 from being nitrided.

When a mixed gas that contains an inert gas is used, the concentration of the oxygen-atom containing gas in an atmosphere can be thus lowered, and therefore the oxidation rate of the surface of the SiC epitaxial layer 3 can be lowered. This makes it possible to perform the pretreatment oxide-film forming step (S7) for a long time while preventing the surface of the SiC epitaxial layer 3 from being excessively oxidized. Additionally, it is also possible to restrain the diffusion furnace 123 from being excessively oxidized.

Although it is preferable for the content ratio of He or Ar to fall within, for example, 99.9% to 90% with respect to an oxygen-atom containing gas, this content ratio can be appropriately changed in accordance with the film thickness of a pretreatment oxide film 28 to be formed.

As described above, according to the manufacturing steps according to the modification of the first preferred embodiment, the surface of the SiC epitaxial layer 3 has already been covered with the pretreatment oxide film 28 when the impurity ion activating step (S2) is started, and therefore it is possible to restrain the sublimation or migration of atoms from occurring in the surface of the SiC epitaxial layer 3 from immediately after starting the impurity ion activating step (S2).

Additionally, during the impurity ion activating step (S2), it is possible not only to restrain the pretreatment oxide film 28 from vaporizing but also to reliably restrain the surface of the SiC epitaxial layer 3 from being exposed because the composite oxide film 40 that unitedly includes the thermally-oxidized film 24 and the pretreatment oxide film 28 is formed. As a result, it is possible to further restrain the sublimation or migration of atoms from occurring in the surface of the SiC epitaxial layer 3.

Next, a semiconductor device 31 according to a second preferred embodiment of the present invention will be described with reference to FIG. 7.

FIG. 7 is a schematic cross-sectional view of a semiconductor device according to a second preferred embodiment of the present invention. The same reference sign is given to a component equivalent to each component shown in FIG. 1 to FIG. 6B mentioned above, and a description of the component equivalent thereto is omitted. It should be noted that FIG. 7 is a schematic cross-sectional view that depicts a unit cell of a semiconductor element formed in the semiconductor device 31.

The semiconductor device 31 includes an n$^+$-type SiC substrate 2 and an n$^-$-type SiC epitaxial layer 3 formed on the SiC substrate 2 in the same way as in the first preferred embodiment mentioned above. The semiconductor device 31 includes a Schottky barrier diode 32 serving as an example of a semiconductor element.

The Schottky barrier diode 32 includes an insulating layer 35 that is formed on the SiC epitaxial layer 3 and that selectively has an opening 36, an anode electrode 37 formed so as to overlap with the insulating layer 35 by backfilling the opening 36, a cathode electrode 38 formed on a back surface of the SiC substrate 2, and p-type guard ring regions 33 each of which is selectively formed on the surface of the SiC epitaxial layer 3 so as to be placed on the inner side and the outer side of the opening 36 like a bridge. The impurity concentration of the p-type guard ring region 33 is, for example, $1.0 \times 10^{16}$ cm$^{-3}$ to $1.0 \times 10^{19}$ cm$^{-3}$.

The anode electrode 37 enters the opening 36 formed in the insulating layer 35, and is allowed to make a Schottky junction with the surface of the SiC epitaxial layer 3. The anode electrode 37 is connected to an upper wiring 29.

On the other hand, the cathode electrode 38 is allowed to make ohmic contact with the SiC substrate 2. The cathode electrode 38 is connected to a back wiring 30. In the second preferred embodiment, the semiconductor device 31 provided with the Schottky barrier diode 32 is thus formed.

Figure 8:
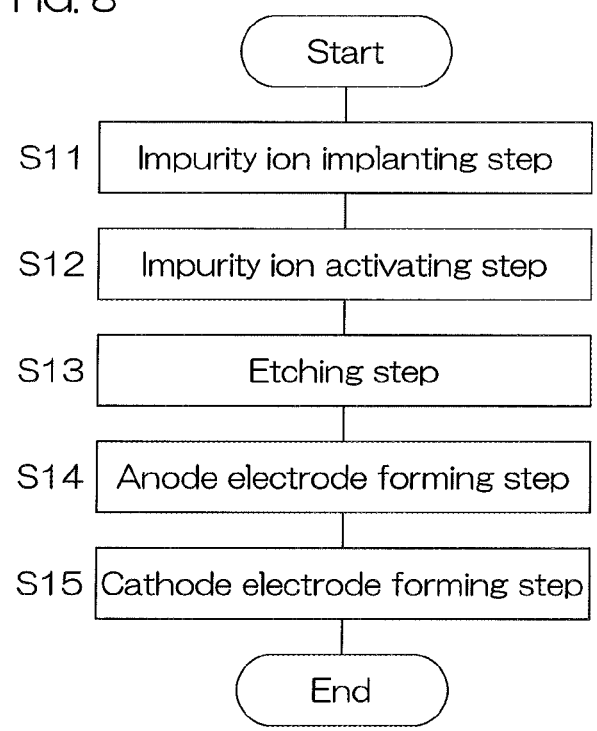
FIG. 8 is a flow chart of manufacturing steps of the semiconductor device of FIG. 7.

Next, manufacturing steps of the semiconductor device 31 will be described with reference to FIG. 8 and FIGS. 9A to 9D. FIG. 8 is a flow chart of manufacturing steps of the semiconductor device of FIG. 7. FIG. 9A to FIG. 9D are views showing manufacturing steps of the semiconductor device of FIG. 8. The same reference sign is given to a component equivalent to each component shown in FIG. 1 to FIG. 6B mentioned above, and a description of the component equivalent thereto is omitted.

To manufacture the semiconductor device 31, the SiC epitaxial layer 3 is formed on the SiC substrate 2 in the same way as in the first preferred embodiment mentioned above, for example, as shown in FIG. 9A.

Figure 9A:
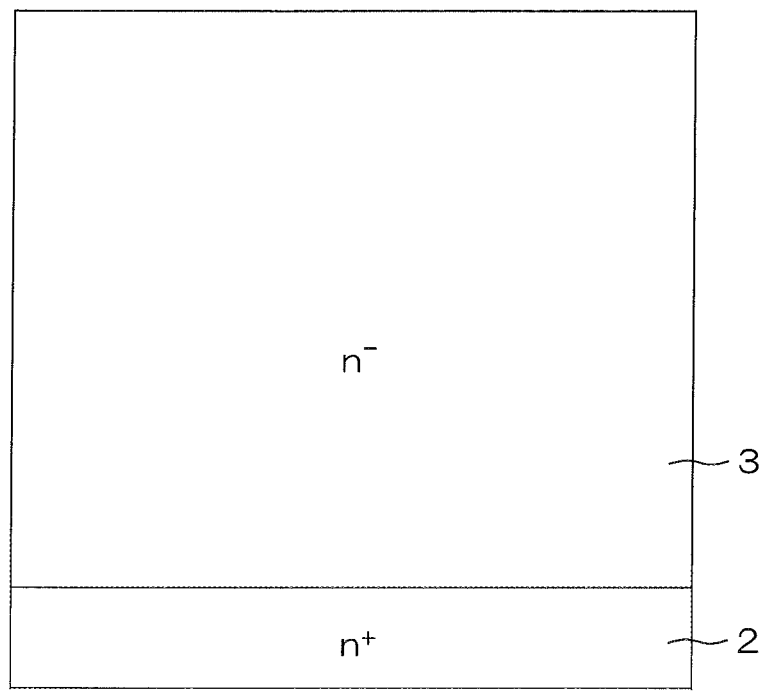
Figure 9B:
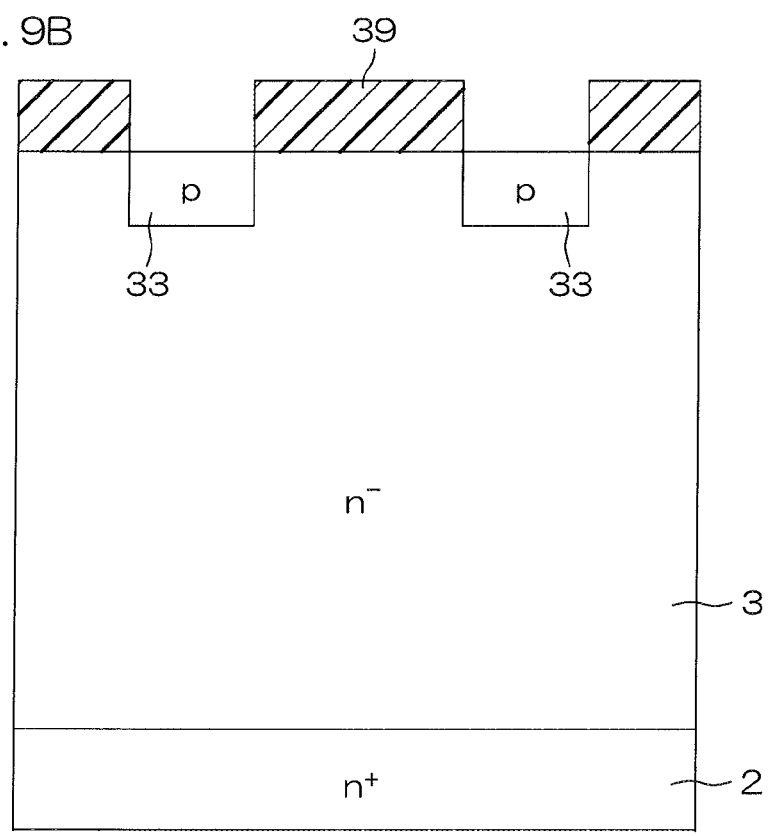

Thereafter, as shown in FIG. 9B, an ion implanting mask 39 that selectively has an opening in a region to form the p-type guard ring region 33 is formed on the surface of the SiC epitaxial layer 3. Thereafter, p-type impurity ions are implanted into the SiC epitaxial layer 3 through the ion implanting mask 39. As a result, the p-type guard ring region 33 is formed (S11: Impurity ion implanting step). Thereafter, the ion implanting mask 39 is removed.

Thereafter, as shown in FIG. 9C, the SiC substrate 2 is placed in the heat treat furnace 23, and the impurity ion activating step (S12) is performed. Thereafter, the SiC substrate 2 is taken out from the heat treat furnace 23, and the thermally-oxidized film 24 formed on the surface of the SiC epitaxial layer 3 is removed by etching (S13: Etching step).

The impurity ion activating step (S12) and the etching step (S13) are the same in contents and in conditions as the impurity ion activating step (S2) and the etching step (S3) according to the first preferred embodiment mentioned above, and therefore a description of these steps is omitted.

Thereafter, as shown in FIG. 9D, an insulating layer 35 is formed on the surface of the SiC epitaxial layer 3, and an opening 36 that selectively exposes the p-type guard ring regions 33 and regions between the p-type guard ring regions 33 is formed. Thereafter, the anode electrode 37 is formed so as to overlap with the insulating layer 35 by backfilling the opening 36 (S14: Anode electrode forming step).

Thereafter, the cathode electrode is formed on the back surface of the SiC substrate 2 (S15: Cathode electrode forming step). A passivation film may be formed so as to cover the anode electrode 37 and the insulating layer 35 prior to the cathode electrode forming step (S15). Thereafter, the upper wiring 29 and the back wiring 30 are connected to the anode electrode 37 and the cathode electrode 38, respectively. The semiconductor device 31 shown in FIG. 7 can be obtained through the aforementioned steps.

As described above, in the manufacturing steps according to the second preferred embodiment, the impurity ion implanting step (S11) is first performed, and then the impurity ion activating step (S12) is performed in the same way as in the manufacturing steps according to the first preferred embodiment mentioned above. Therefore, it is possible to fulfill the same effect as the effect mentioned about the manufacturing steps according to the first preferred embodiment. Additionally, according to the arrangement of the semiconductor device 31, it is possible to provide the Schottky barrier diode 32 that has an excellent leakage current characteristic and an excellent forward characteristic.

Next, a modification of the manufacturing steps of the semiconductor device 31 according to the second preferred embodiment will be described with reference to FIG. 10.

Figure 10:
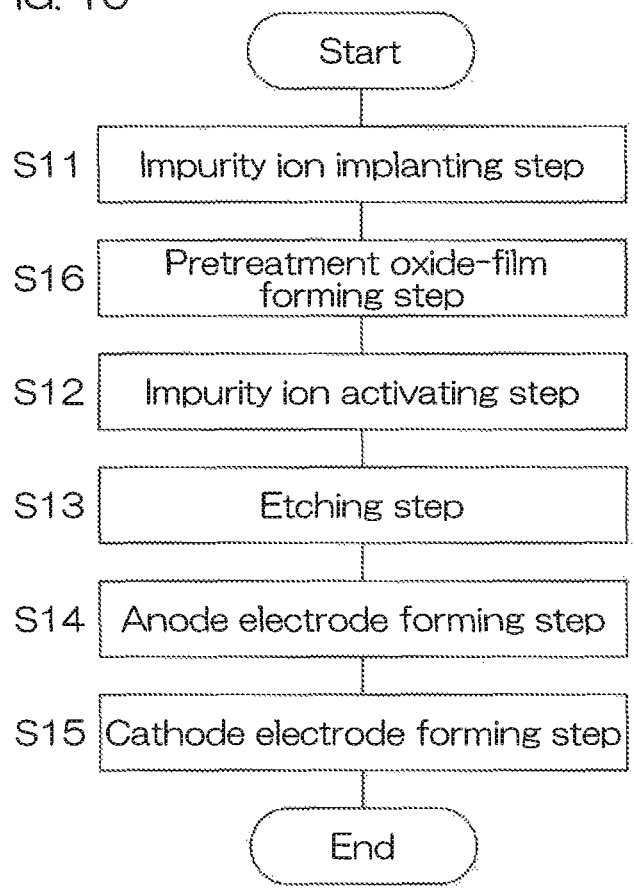
FIG. 10 is a flow chart of a modification of the manufacturing steps of FIG. 8.

FIG. 10 is a flow chart of a modification of the manufacturing steps of FIG. 8.

The manufacturing steps of the semiconductor device 31 of FIG. 10 differ from the manufacturing steps of the semiconductor device 31 of FIG. 8 in the fact that the pretreatment oxide-film forming step (S16) is added prior to the impurity ion activating step (S12).

The pretreatment oxide-film forming step (S16) is the same in contents and in conditions as the pretreatment oxide-film forming step according to the modification of the first preferred embodiment mentioned above (see S7 and FIG. 5), and therefore a description of the pretreatment oxide-film forming step (S16) is omitted.

After completing the pretreatment oxide-film forming step (S16), the process ranging from the impurity ion activating step (S12) to the cathode electrode forming step (S15) is performed in this order under the same conditions as in the second preferred embodiment mentioned above, and the semiconductor device 31 is manufactured.

As described above, according to the modification of the manufacturing steps according to the second preferred embodiment, it is possible to fulfill the same effect as the effect mentioned about the modification of the manufacturing steps according to the first preferred embodiment and as the effect mentioned about the second preferred embodiment.

Although the preferred embodiments of the present invention have been described as above, the present invention can be embodied in other modes.

For example, the pretreatment oxide film 28 may be formed on the surface of the SiC epitaxial layer 3 according to a CVD method although the step of forming the pretreatment oxide film 28 by applying thermal oxidation treatment to the surface of the SiC epitaxial layer 3 (S7 and S16) has been described in the modification of the manufacturing method according to the first preferred embodiment and in the modification of the manufacturing method according to the second preferred embodiment. In this case, it is possible to form the pretreatment oxide film 28 that has a comparatively great film thickness.

Additionally, the pretreatment oxide-film forming step (S7 and S16) may be performed by using the heat treat furnace 23 at the impurity ion activating step (S2 and S12) although the method in which the pretreatment oxide-film forming step (S7 and S16) is performed in the diffusion furnace 123 has been described in the modification of the manufacturing method according to the first preferred embodiment and in the modification of the manufacturing method according to the second preferred embodiment. In this case, it is possible to unite two steps consisting of the pretreatment oxide-film forming step (S7 and S16) and the impurity ion activating step (S2 and S12) into a single step, and therefore it is possible to reduce the number of manufacturing steps.

Additionally, the impurity ion activating step (S2 and S12) may be performed under the condition of only an inert gas atmosphere because the pretreatment oxide film 28 has already been formed on the surface of the SiC epitaxial layer 3 (S7 and S16) prior to the impurity ion activating step (S2 and S12) although a description has been given of the process in which the impurity ion activating step (S2 and S12) is performed in a gas atmosphere that contains oxygen atoms in the modification of the manufacturing method according to the first preferred embodiment and in the modification of the manufacturing method according to the second preferred embodiment.

In this case, it is possible to prevent the heat treat furnace 23 from being oxidized. Additionally, it is possible to perform the impurity ion activating step (S2 and S12) by use of a carbon-made heat treat furnace that is comparatively low in cost, and therefore it is possible to reduce production costs.

Additionally, a pretreatment insulating film formed by depositing an insulating material differing from the pretreatment oxide film 28 may be employed instead of the pretreatment oxide film 28 although the manufacturing step in which the pretreatment oxide film 28 is formed on the surface of the SiC epitaxial layer 3 (S7 and S16) has been described in the modification of the manufacturing method according to the first preferred embodiment and in the modification of the manufacturing method according to the second preferred embodiment. This pretreatment insulating film can be formed, for example, by depositing an insulating material on the surface of the SiC epitaxial layer 3 according to the CVD method.

The insulating material of the pretreatment insulating film is, for example, SiN, $Al_2O_3$, or polysilicon. As described above, this method of forming the pretreatment insulating film also makes it possible to fulfill the same effect as in a case in which the pretreatment oxide film 28 is formed.

Additionally, although an arrangement in which the vertical MOSFET 5 is formed as an example of a semiconductor element has been described in the first preferred embodiment, it may be an arrangement in which a lateral MOSFET is formed. Additionally, a trench type MOSFET may be formed by forming a trench such that the surface of the SiC epitaxial layer 3 is dug down in the depth direction and by burying the gate electrode 10 in the trench through the gate oxide film 11.

Additionally, although arrangements in which the MOSFET 5 and the Schottky barrier diode 32 each of which serves as a semiconductor element are formed have been described in the first and second preferred embodiments, the present invention is not limited to these. In other words, it is only necessary to form a semiconductor element by using regions of impurities implanted in the SiC epitaxial layer 3, and therefore those may be arrangements in which, for example, BJTs (Bipolar Junction Transistor), IGBTs (Insulated Gate Bipolar Transistor), JFETs (Junction Field Effect Transistor), etc., are formed. Additionally, it may be an arrangement in which some of these semiconductor elements are selectively formed on the SiC epitaxial layer 3. Besides, various circuit elements, such as a capacitor and a register, may be formed.

Additionally, a semiconductor device having a multi-layer stacked structure made by stacking other semiconductor layers on the SiC epitaxial layer 3 may be formed. Additionally, integrated circuits, such as LSI (Large Scale Integration), SSI (Small Scale Integration), MSI (Medium Scale Integration), VLSI (Very Large Scale Integration), and ULSI (Ultra-Very Large Scale Integration), may be arranged by combining those semiconductor elements and circuit elements, etc., together.

Additionally, although an arrangement in which the n-type SiC substrate 2 is formed has been described in the first and second preferred embodiments, it may be an arrangement in which a p-type SiC substrate 2 having an inverted conductivity type is formed. In this case, the conductivity type of the SiC epitaxial layer 3 is arranged to be a $p^-$-type, and the conductivity types of other impurity regions are also arranged to be inverted.

Additionally, at this time, the carrier lifetime of a semiconductor device having a $p^-$-type SiC epitaxial layer 3 and a p-type SiC substrate 2 formed through the same step as each step shown in FIG. 2, FIG. 5, FIG. 8, and FIG. 10 is 2 μsec to 3 μsec.

Besides, various design changes can be made within the scope of the matters recited in the appended claims.

The invention claimed is:

1. A semiconductor device comprising:
an SiC semiconductor layer; and
a semiconductor element including impurity regions selectively formed in the surface of the SiC semiconductor laver, wherein
a carrier lifetime of the SiC semiconductor layer is 30 µsec or more,
the semiconductor element includes a MOSFET, and
the MOSFET includes:
a first conductive type source region,
a second conductive type body region formed so as to surround the source region, and
a gate electrode formed on the SiC semiconductor layer with a gate oxide film therebetween.

2. The semiconductor device according to claim 1, wherein, an impurity concentration of the source region is $1.0 \times 10^{17}$ cm$^{-3}$ to $1.0 \times 10^{20}$ cm$^{-3}$.

3. The semiconductor device according to claim 1, wherein, an impurity concentration of the body region is $1.0 \times 10^{16}$ cm$^{-3}$ to $1.0 \times 10^{19}$ cm$^{-3}$.

4. A semiconductor device comprising:
an SiC semiconductor laver; and
a semiconductor element including impurity regions selectively formed in the surface of the SiC semiconductor layer, wherein
a carrier lifetime of the SiC semiconductor layer is 30 µsec or more,
the semiconductor element includes a Schottky barrier diode, and
the Schottky barrier diode includes:
an insulating layer formed on the SiC semiconductor layer and having an opening,
an anode electrode formed so as to overlap with the insulating layer by backfilling the opening, and
a first conductive type guard ring region formed on the SiC semiconductor layer so as to be placed on the inner side and the outer side of the opening like a bridge.

5. The semiconductor device according to claim 4, wherein, an impurity concentration of the guard ring region is $1.0 \times 10^{16}$ cm$^{31\ 3}$ to $1.0 \times 10^{19}$ cm$^{-3}$.

* * * * *